(12) United States Patent
Sekimoto et al.

(10) Patent No.: US 6,600,350 B2
(45) Date of Patent: Jul. 29, 2003

(54) POWER-ON/OFF RESET CIRCUIT

(75) Inventors: Yasuhiko Sekimoto, Hamakita (JP); Masao Noro, Hamamatsu (JP)

(73) Assignee: Yamaha Corporation, Hamamatsu (JP)

( * ) Notice: Subject to any disclaimer, the term of this patent is extended or adjusted under 35 U.S.C. 154(b) by 0 days.

(21) Appl. No.: 10/145,270

(22) Filed: May 14, 2002

(65) Prior Publication Data

US 2002/0171462 A1 Nov. 21, 2002

(30) Foreign Application Priority Data

May 16, 2001 (JP) .................... P2001-146604

(51) Int. Cl.[7] ................................ H03L 7/00
(52) U.S. Cl. ...................................... 327/143
(58) Field of Search ................. 327/142, 143, 327/198

(56) References Cited

U.S. PATENT DOCUMENTS

| | | | | |
|---|---|---|---|---|
| 5,886,550 A | * | 3/1999 | Kwon et al. ............. | 327/143 |
| 5,969,549 A | * | 10/1999 | Kim et al. ............... | 327/143 |
| 6,060,918 A | * | 5/2000 | Tsuchida et al. ......... | 327/143 |
| 6,222,399 B1 | * | 4/2001 | Imbornone et al. ....... | 327/143 |
| 6,259,284 B1 | * | 7/2001 | Hwang et al. ........... | 327/142 |
| 6,281,723 B1 | * | 8/2001 | Tailliet .................. | 327/143 |

FOREIGN PATENT DOCUMENTS

JP 59-052327 3/1984

* cited by examiner

*Primary Examiner*—Jeffrey Zweizig
(74) *Attorney, Agent, or Firm*—Pillsbury Winthrop LLP

(57) ABSTRACT

A power-on/off reset circuit comprises a capacitor, a first transistor, a second transistor, a first current mirror circuit, a second current mirror circuit, and an inverter. In a power-on mode where the source voltage gradually increases in level, the capacitor is charged via the first transistor. The first current mirror circuit comprising a pair of transistors allows a current to flow therein in proportion to a potential of the capacitor. The second transistor converts the current to a voltage, which is input to the inverter to provide a first reset signal in the power-on mode. In a power-off mode where the source voltage gradually decreases in level, the second current mirror circuit comprising a pair of transistors temporarily increases the input voltage of the inverter to provide a second reset signal.

14 Claims, 7 Drawing Sheets

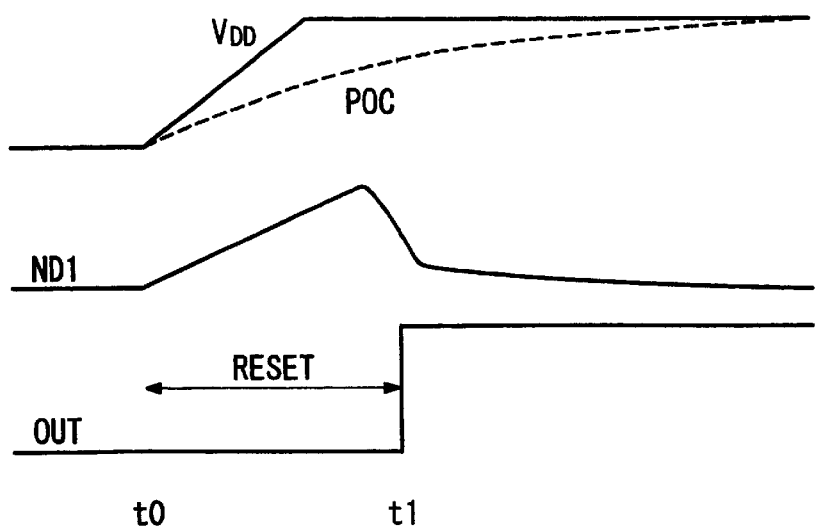

FIG. 7A
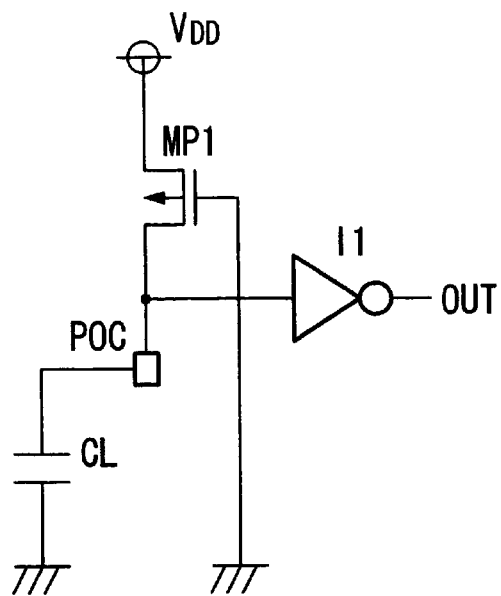
FIG. 7B
FIG. 7C
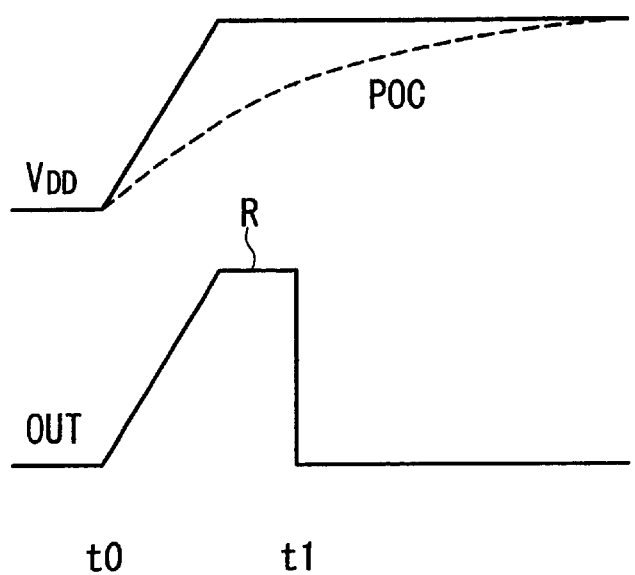

POWER-ON/OFF RESET CIRCUIT

BACKGROUND OF THE INVENTION

1. Field of the Invention

This invention relates to power-on/off reset circuits that reset semiconductor integrated circuits in power-on mode and power-off mode.

2. Description of the Related Art

FIG. 7A shows a typical example of a reset circuit that operates in a power-on mode. This reset circuit comprises a capacitor CL, a p-type field effect transistor (FET) MP1, and an inverter I1. Specifically, one end of the capacitor CL is grounded, while the other end (corresponding to a terminal POC) is connected with a positive source voltage $V_{DD}$ via the p-type FET MP1 and is also connected with an input of the inverter I1. At time t0, the positive source voltage $V_{DD}$ starts increasing the level thereof as shown in FIG. 7B, so that the capacitor CL starts being charged. During the progression of the charging of the capacitor CL, the potential of the terminal POC gradually increases. Since the input voltage of the inverter I1 connected with the terminal POC is normally below the prescribed threshold allowing inversion of the inverter I1, the output of the inverter I1 (see 'OUT' shown in FIG. 7C) gradually increases in accordance with the increase of the source voltage $V_{DD}$. At time t1 when a certain time has elapsed after the source voltage $V_{DD}$ reaches the prescribed level, the potential of the terminal POC exceeds the threshold so as to allow an inversion of the inverter I1. Therefore, in the rise time of the source voltage $V_{DD}$, the reset circuit of FIG. 7A provides at the output (OUT) thereof a reset signal having a high (H) level, which is designated by a symbol 'R' in FIG. 7C. However, the aforementioned reset circuit has a drawback in that it cannot output a reset signal in a power-off mode. This will be described further with reference to FIGS. 10A to 10C. In the reset circuit shown in FIG. 10A which is an equivalent of the reset circuit of FIG. 7A, the source voltage $V_{DD}$ gradually drops in a power-off mode as shown in FIG. 10B, while the potential of the terminal POC correspondingly drops with a certain delay time due to the time constant of the capacitor CL and the FET MP1. For this reason, the input voltage of the inverter I1 connected with the terminal POC would not be reduced to be lower than the source voltage $V_{DD}$, so that the output of the inverter I1 remains at a low level (LO) as shown in FIG. 10C. That is, the aforementioned reset circuit of FIG. 10A cannot reliably provide a reset signal in a power-off mode.

It is strongly demanded in semiconductor integrated circuits (ICs) and LSI devices that reset signals are reliably provided in a power-off mode, which will be described below.

Suppose that two integrated circuits IC1 and IC2 operate independently of each other by their respective power sources as shown in FIG. 8, wherein the integrated circuit IC1 provides control signals to control the operation of the integrated circuit IC2. If the integrated circuit IC1 does not provide a reset function in a power-off mode, it may provide 'unexpected' control signals to the integrated circuit IC2, which may cause problems unexpectedly. In the worst case, the integrated circuit IC2 may run away and depart from the normal operation. Therefore, it is required that the integrated circuit IC1 reliably provides a reset function in a power-off mode, which will ensure that the integrated circuit IC2 will be normally set without problems.

Suppose that an integrated circuit (IC) has a function of ringing sound by a speaker as shown in FIG. 9. If it does not provide a reset function in a power-off mode, the speaker may unexpectedly produce a high-pitch electronic sound like 'peep', which is offensive.

SUMMARY OF THE INVENTION

It is an object of the invention to provide a power on/off reset that is capable of reliably providing reset signals in both a power-on mode and a power-off mode.

A power-on/off reset circuit comprises a capacitor, a first transistor, a second transistor, a first current mirror circuit, a second current mirror circuit, and an inverter. In a power-on mode where the source voltage ($V_{DD}$) gradually increases in level, the capacitor is charged via the first transistor. The first current mirror circuit comprising a pair of transistors allows a current to flow therein in proportion to a potential of the capacitor. The second transistor converts the current to a voltage, which is input to the inverter to provide a first reset signal in the power-on mode. In a power-off mode where the source voltage gradually decreases in level, the second current mirror circuit comprising a pair of transistors temporarily increases the input voltage of the inverter to provide a second reset signal.

Thus, the power-on/off reset circuit is capable of reliably providing reset signals in both the power-on mode and power-off mode.

BRIEF DESCRIPTION OF THE DRAWINGS

These and other objects, aspects, and embodiments of the present invention will be described in more detail with reference to the following drawing figures, in which:

FIG. 2A shows variations of a POC potential together with a source voltage $V_{DD}$ in a power-on mode;

FIG. 2B shows variations of input voltage ND1 of an inverter I2 in the power-on mode;

FIG. 2C shows an output of the inverter I2 in the power-on mode;

FIG. 3A shows variations of a POC potential together with a source voltage $V_{DD}$ in a power-off mode;

FIG. 3B shows variations of input voltage ND1 of the inverter I2 in the power-off mode;

FIG. 3C shows an output of the inverter I2 in the power-off mode;

FIG. 7A shows an example of a reset circuit that operates in a power-on mode;

FIG. 7B shows variations of a POC potential together with a source voltage $V_{DD}$ in a power-on mode;

FIG. 7C shows variations of an output of the reset circuit of FIG. 7A;

DESCRIPTION OF THE PREFERRED EMBODIMENTS

This invention will be described in further detail by way of examples with reference to the accompanying drawings.

First Embodiment

Figure 1:
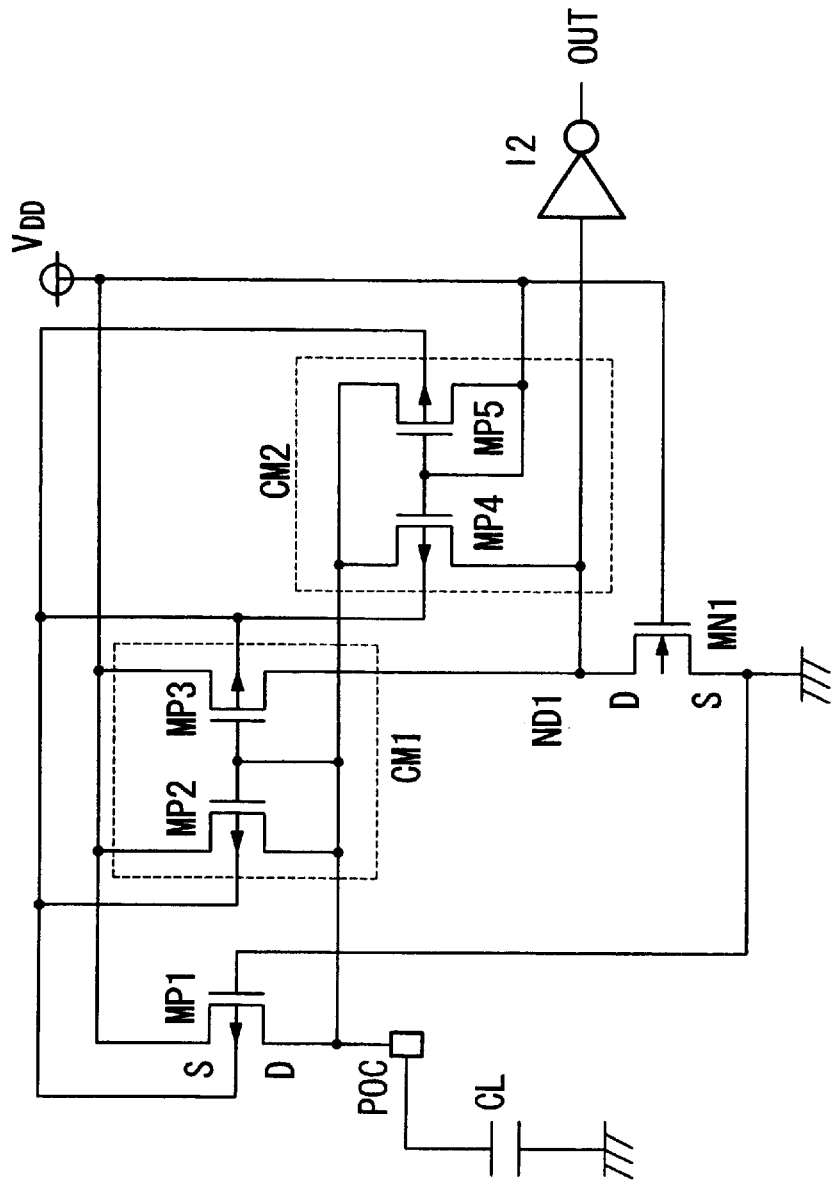
FIG. 1 is a circuit diagram showing the configuration of a power-on/off reset circuit in accordance with a first embodiment of the invention.

FIG. 1 is a circuit diagram showing the configuration of a power-on/off reset circuit in accordance with a first embodiment of this invention. Herein, a capacitor CL and a p-type field effect transistor (FET) MP1 are connected in series with respect to a source voltage $V_{DD}$, wherein one end of the capacitor CL is grounded, and the other end corresponds to a terminal POC and is connected with the FET MP1, which acts as a resistor because its gate is grounded. A pair of p-type field effect transistors MP2 and MP3 are combined together to form a current mirror circuit. Specifically, the drain of the p-type FET MP2 is connected to the terminal POC, while the drain of the p-type FET MP3 is connected to the drain of an n-type FET MN1. Sources of the p-type FETs MP2 and MP3 are both connected with the source voltage $V_{DD}$. The gate of the n-type FET MN1 is connected with the source voltage $V_{DD}$, and its source is grounded. Therefore, the n-type FET MN1 acts as a resistor.

A pair of p-type FETs MP4 and MP5 are combined together to form a current mirror circuit. Specifically, the drain of the FET MP4 is connected to a connection point between the FETs MP3 and MN1 as well as an input of an inverter I2. Both the gate and drain of the FET MP5 are connected with the source voltage $V_{DD}$. In addition, both the sources of the FETs MP4 and MP5 are connected to the terminal POC. The inverter I2 provides a reset signal at an output (OUT) thereof. All well regions of the FETs MP1 to MP5 are commonly connected. Alternatively, all the FETs MP1 to MP5 are formed on the common well region. The FETs MP1 to MP5 have prescribed on-resistances to satisfy the following inequalities.

MP1>>MP3>>MP2

MP4>>MP5

In the aforementioned configuration, a pair of the FETs MP2 and MP3 operate in a power-on (reset) mode, while a pair of the FETs MP4 and MP5 operate in a power-off (reset) mode.

Next, the operations of the power-on/off reset circuit of the first embodiment shown in FIG. 1 will be described in detail.

(1) Power-On Mode

The overall operation of the power-on/off reset circuit in a power-on mode will be described with reference to time charts shown in FIGS. 2A to 2C. At time t0 when electric power is applied to the circuitry, the source voltage $V_{DD}$ gradually increases in level as shown in FIG. 2A. At this time, the capacitor is being charged via the FET MP1 under the source voltage $V_{DD}$, so that the potential of the terminal POC gradually increases as shown in FIG. 2A. When the potential of the terminal POC exceeds the prescribed voltage of about 0.8 V, the FET MP2 is turned on to provide a certain on-resistance, which is smaller than that of the FET MP1. Thereafter, the capacitor CL is being charged via the FET MP2, instead of the FET MP1, under the source voltage $V_{DD}$. Therefore, the potential of the terminal POC further increases in accordance with the increasing of the source voltage $V_{DD}$. In addition, a current flowing through the FET MP2 correspondingly increases in accordance with the increasing of the source voltage $V_{DD}$.

A certain current is forced to flow through the FET MP3 in proportion to the current that flows through the FET MP2 and is gradually increasing in accordance with the increasing of the source voltage $V_{DD}$. Therefore, the input voltage 'ND1' of the inverter I2 gradually increases in level as shown in FIG. 2B. In this case, the input voltage ND1 increases in accordance with the increasing of the source voltage $V_{DD}$, wherein it would be normally above the threshold of the inverter I2, so that the output of the inverter I2 remains at a low (L) level, which is shown in FIG. 2C.

After the source voltage $V_{DD}$ reaches the prescribed level, the potential of the terminal POC is continuously increasing. However, the current flowing through the FET MP2 decreases in the progression of the charging of the capacitor CL because the source voltage $V_{DD}$ does not increase more than the prescribed level. This causes a reduction of the current flowing through the FET MP3, so that the input voltage ND1 of the inverter I2 starts decreasing. At time t1 when the input voltage ND1 becomes lower than the threshold of the inverter I2, the output of the inverter I2 is inverted and becomes a high (H) level, which is shown in FIG. 2C.

As described above, the power-on/off reset circuit of the first embodiment provides a reset signal (OUT) having a low level for a certain time period in the rise time of the source voltage $V_{DD}$.

(2) Power-Off Mode

The overall operation of the power-on/off reset circuit in a power-off mode will be described with reference to time charts shown in FIGS. 3A to 3C. Just before time t0 when the electric power applied to the circuitry is cut off, the potential of the terminal POC substantially matches the source voltage $V_{DD}$ at its prescribed level, wherein both the FETs MP2 and MP5 are turned off so that the input voltage ND1 of the inverter I2 matches the ground level (see FIG. 3B). As a result, the output of the inverter I2 is at a high (H) level, which is shown in FIG. 3C.

At time t0 when the power supply is cut off, the source voltage $V_{DD}$ gradually decreases as shown in FIG. 3A. In this case, as charges accumulated in the capacitor CL are gradually discharged, the potential of the terminal POC gradually decreases at a slow rate that is slower than the source voltage $V_{DD}$ (see FIG. 3A). When the drain potential of the FET MP5 becomes lower than its source potential by a certain value or more, a certain current is forced to flow from the terminal POC towards the power source ($V_{DD}$) via the FET MP5. Due to the current flowing through the FET MP5, its corresponding current flows through the FET MP4, so that the input voltage ND1 gradually increases after time t0 (see FIG. 3B). That is, in accordance with the decreasing of the source voltage $V_{DD}$, the input voltage ND1 increases and then exceeds the threshold of the inverter I2 at time t1. Hence, the output of the inverter I2 is inverted and is turned to a low (L) level.

After time t1, the input voltage ND1 further increases, while the potential of the terminal POC still gradually decreases. When the potential of the terminal POC reaches the prescribed level, the input voltage ND1 is turned off from a peak and then starts decreasing. The input voltage ND1 will become zero when charges accumulated in the capacitor CL are completely discharged.

As described above, the power-on/off reset circuit of the first embodiment provides a reset signal having a low level for a certain time period in the power-off mode.

The first embodiment is designed in such a way that the well regions of the transistors are not directly connected with the source voltage $V_{DD}$ and are placed in a floating state because of the following reason.

That is, when the source voltage $V_{DD}$ becomes lower than the potential of the terminal POC, in other words, when it becomes lower than Vf of the parasitic diode of the drain of the transistor, the parasitic diode should be turned on so that charges of the capacitor CL may be discharged towards the power source via the parasitic diode. To avoid such a problem, the well region of the transistor is placed in a floating state.

Second Embodiment

Figure 4:
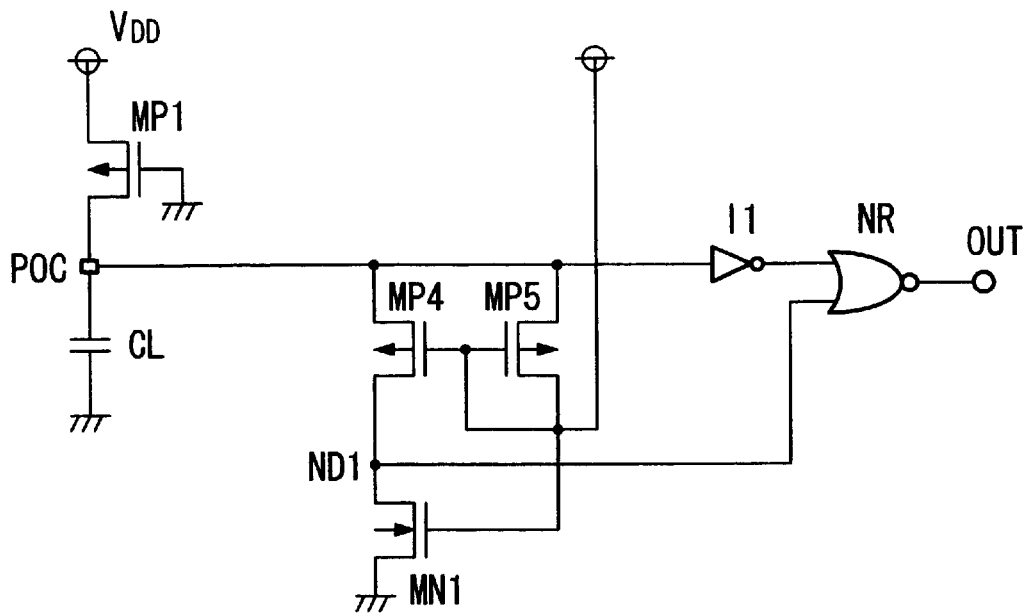
FIG. 4 is a circuit diagram showing the configuration of a power-on/off reset circuit in accordance with a second embodiment of the invention.
Figure 5A:
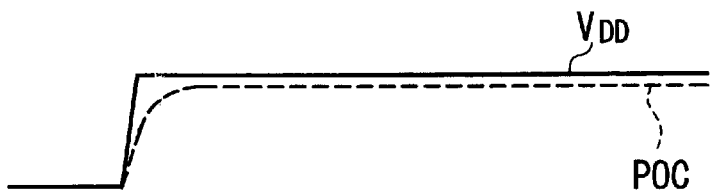
FIG. 5A shows variations of a POC potential together with a source voltage $V_{DD}$ in its rise time.
Figure 5B:
FIG. 5B shows an output of an inverter I1 in the rise time of the source voltage $V_{DD}$.
Figure 5C:
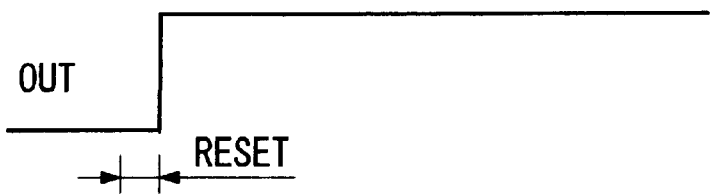
FIG. 5C shows an output of a NOR gate NR in the rise time of the source voltage $V_{DD}$.

FIG. 4 is a circuit diagram showing the configuration of a power-on/off reset circuit in accordance with a second embodiment of the invention. The power-on/off reset circuit of the second embodiment comprises two sections, which provide reset signals in a power-on mode and a power-off mode respectively. That is, the first section of the power-on/off reset circuit shown in FIG. 4 comprises a p-type FET MP1, a capacitor CL, and an inverter I1, which provide a reset signal in a rise time of the source voltage $V_{DD}$. Therefore, the first section is constituted similarly to the foregoing reset circuit shown in FIG. 7A. The overall operation of the first section can be similarly explained with reference to time charts shown in FIGS. 5A to 5C. That is, FIG. 5A shows variations of the potential of the POC terminal together with the source voltage $V_{DD}$, and FIG. 5B shows the output of the inverter I1. That is, the inverter I1 outputs a pulse-like signal in the rise time of the source voltage $V_{DD}$. Such an output of the inverter I1 is inverted by a NOR gate NR, which in turn provides a reset signal having a low (L) level (see FIG. 5C) in the rise time of the source voltage $V_{DD}$.

The second section of the power-on/off reset circuit shown in FIG. 4 comprises p-type FETs MP4 and MP5, and an n-type FET MN1, which provide a reset signal in a fall time of the source voltage $V_{DD}$. Therefore, the second section is constituted similarly to the aforementioned circuitry of the first embodiment shown in FIG. 1, which provides a reset signal in the fall time of the source voltage $V_{DD}$. A signal (ND1) at a connection point between the FETs MP4 and MN1 is inverted by the NOR gate NR, which in turn provides a reset signal in the fall time of the source voltage $V_{DD}$.

Third Embodiment

Figure 6:
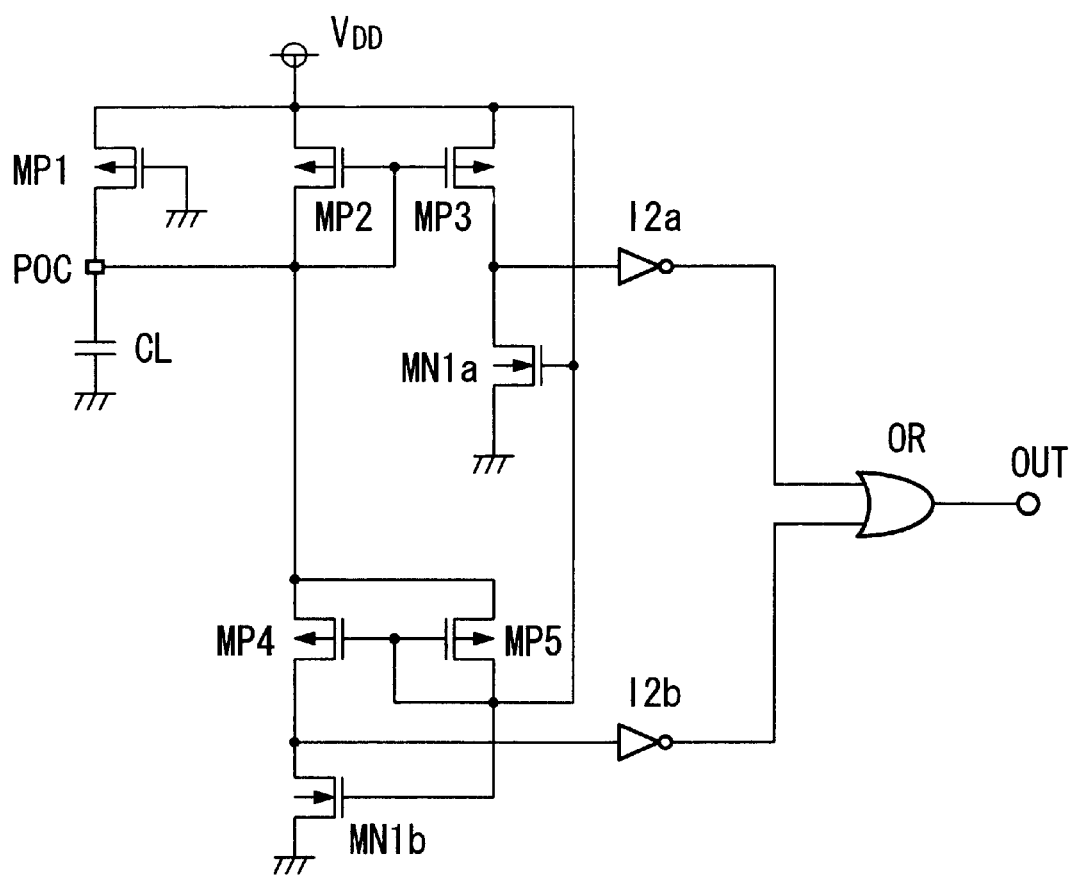
FIG. 6 is a circuit diagram showing the configuration of a power-on/off reset circuit in accordance with a third embodiment of the invention.
Figure 8:
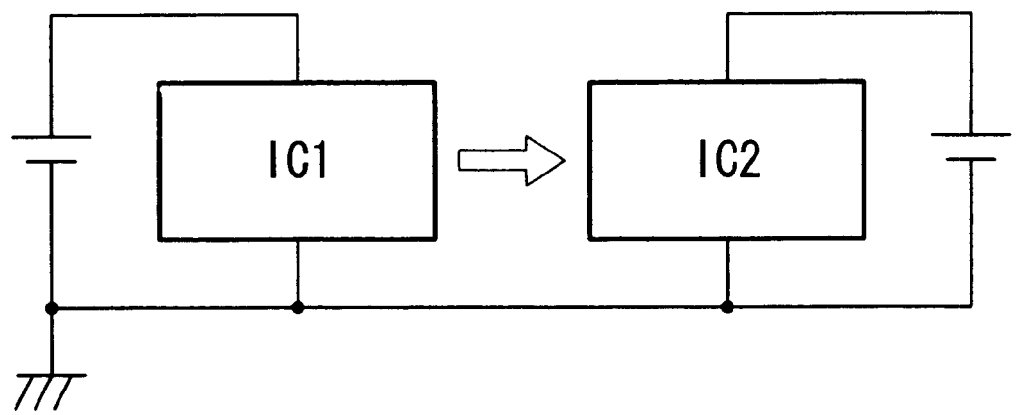
FIG. 8 shows a simple connection of two integrated circuits that operate independently of each other with their respective power sources.
Figure 9:
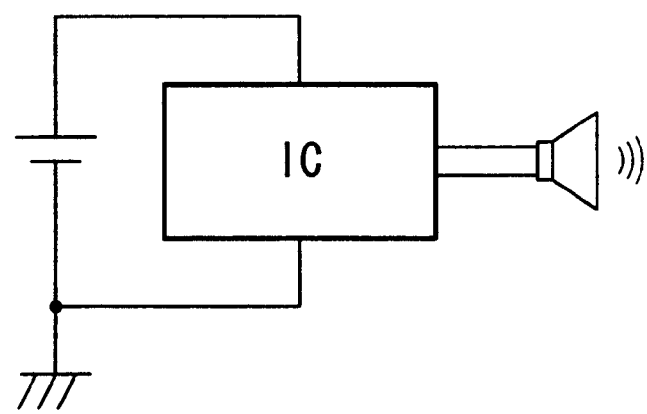
FIG. 9 shows an integrated circuit coupled with a speaker.
Figure 10A:
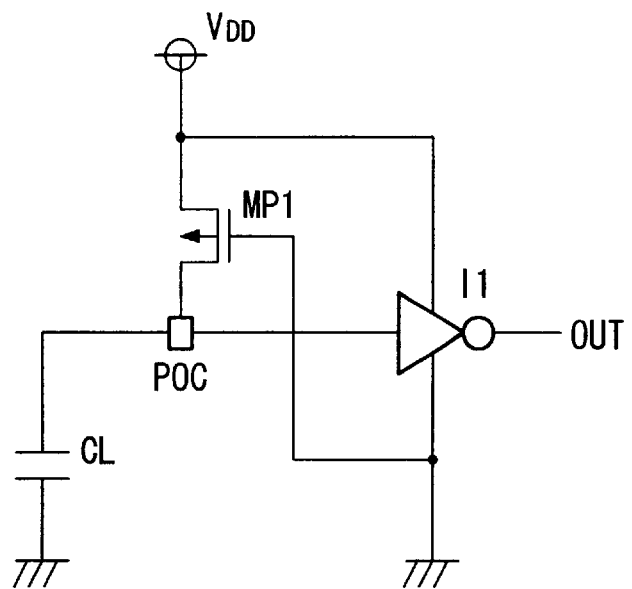
FIG. 10A shows an example of a reset circuit that operates in a power-off mode.
Figure 10B:
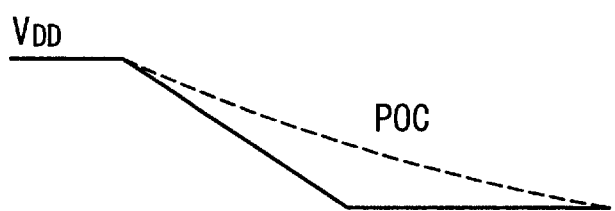
FIG. 10B shows variations of a POC potential together with a source voltage $V_{DD}$ in the power-off mode.
Figure 10C:
FIG. 10C shows an output of the reset circuit shown in FIG. 10A.

FIG. 6 is a circuit diagram showing the configuration of a power-on/off reset circuit in accordance with a third embodiment of the invention. Like the second embodiment, the power-on/off reset circuit of the third embodiment comprises two sections, which provide reset signals in a power-on mode and a power-off mode respectively. That is, the first section of the power-on/off reset circuit shown in FIG. 6 comprises p-type FETs MP1, MP2, and MP3, an n-type FET MN1a, a capacitor CL, and an inverter I2a, which provide a reset signal in a rise time of the source voltage $V_{DD}$. Therefore, the first section is constituted similarly to the aforementioned first embodiment shown in FIG. 1, specifically, the circuitry comprising the FETs MP1, MP2, MP3, and MN1, capacitor CL, and inverter I2, which provide a reset signal in the rise time of the source voltage $V_{DD}$.

The second section of the power-on/off reset circuit shown in FIG. 6 comprises p-type FETs MP4 and MP5, an n-type FET MN1b, and an inverter I2b, which provide a reset signal in a fall time of the source voltage $V_{DD}$. Therefore, the second section is constituted similarly to the aforementioned first embodiment shown in FIG. 1, specifically the circuitry comprising the FETs MP4, MP5, MN1, and inverter I2, which provides a reset signal in the fall time of the source voltage $V_{DD}$. Outputs of the inverters I2a and I2b are supplied to an OR gate (OR), which in turn provides a reset signal for both the rise time and fall time of the source voltage $V_{DD}$.

In the second and third embodiments, the well regions of the transistors are commonly connected together in a floating state. Alternatively, these transistors are formed on the common well region.

In summary, this invention provides a power-on/off reset circuit that contains a power-on reset circuit and a power-off reset circuit. Specifically, the power-on reset circuit provides a reset signal that is turned on in response to the on-timing of the source voltage and is then turned off when the potential of a capacitor reaches the prescribed level. The power-off reset circuit provides a reset signal that is turned on when the potential of the capacitor decreases to a certain value after the off-timing of the source voltage and is sustained until the source voltage becomes substantially zero. Therefore, the power-on/off reset circuit of this invention can provide reset signals for both of the on-timing and off-timing of the source voltage.

As this invention may be embodied in several forms without departing from the spirit or essential characteristics thereof, the present embodiments are therefore illustrative and not restrictive, since the scope of the invention is defined by the appended claims rather than by the description preceding them, and all changes that fall within metes and bounds of the claims, or equivalents of such metes and bounds are therefore intended to be embraced by the claims.

What is claimed is:

1. A power-on/off reset circuit comprising:
   a capacitor;
   a power-on reset circuit for providing a first reset signal at an on-timing of a source voltage, and for turning off the first reset signal when a potential of the capacitor increases to reach a prescribed level in a power-on mode; and
   a power-off reset circuit for providing a second reset signal when a potential of the capacitor decreases down to a certain value after an off-timing of the source voltage, and for sustaining the second reset signal until the source voltage becomes substantially zero in a power-off mode.

2. A power-on/off reset circuit according to claim 1, wherein the power-on reset circuit comprises a first amplification element for supplying a charging current to the capacitor,
   a second amplification element allowing a current to flow therethrough in proportion to the current of the first amplification element,
   a resistor for converting the current of the second amplification element to a voltage, and an inverter for outputting the first reset signal when the voltage of the resistor is above a prescribed threshold in the power-on mode.

3. A power-on/off reset circuit according to claim 1, wherein the power-on reset circuit comprises an amplification element for supplying a charging current to the capacitor, and an inverter for outputting the first reset signal when a potential of the capacitor is below a prescribed threshold in the power-on mode.

4. A power-on/off reset circuit according to claim 1, wherein the power-off reset circuit comprises an amplification element for allowing a current to flow therethrough when the source voltage decreases down to the certain value, wherein the current gradually increases in accordance with further decreasing of the source voltage,
   a resistor for converting the current of the amplification element to a voltage, and
   an inverter for outputting the second reset signal when the voltage of the resistor is above a prescribed threshold in the power-off mode.

5. A power-on/off reset circuit comprising:
   a capacitor;
   a first reset circuit for providing a first reset signal at an on-timing of a source voltage, and for turning off the first reset signal when a potential of the capacitor increases to reach a prescribed level in a power-on mode; and
   a second reset circuit for providing a second reset signal when a potential of the capacitor decreases down to a certain value after an off-timing of the source voltage, and for sustaining the second reset signal until the source voltage becomes substantially zero in a power-off mode.

6. A power-on/off reset circuit according to claim 5, wherein each of the first and second reset circuits is constituted as a current mirror circuit.

7. A power-on/off reset circuit according to claim 6, wherein the current mirror circuit comprises a pair of transistors whose well regions are subjected to a floating voltage in response to the source voltage.

8. A power-on/off reset circuit according to claim 6, wherein the current mirror circuit comprises a pair of transistors which are connected together in such a way that their gates are commonly connected and their sources are supplied with the source voltage or the potential of the capacitor.

9. A power-on/off reset circuit comprising:
   a capacitor;
   a power-on reset circuit for providing a first reset signal at an on-timing of a source voltage, and for turning off the first reset signal when a potential of the capacitor increases to reach a prescribed level in a power-on mode; and
   a power-off reset circuit for providing a second reset signal when a potential of the capacitor decreases down to a certain value after an off-timing of the source voltage, and for sustaining the second reset signal until the source voltage becomes substantially zero in a power-off mode,
   wherein the power-on reset circuit comprises a first amplification element for supplying a charging current to the capacitor,
   a second amplification element allowing a current to flow therethrough in proportion to the current of the first amplification element,
   a resistor for converting the current of the second amplification element to a voltage, and
   an inverter for outputting the first reset signal when the voltage of the resistor is above a prescribed threshold in the power-on mode.

10. A power-on/off reset circuit comprising:
    a capacitor;
    a power-on reset circuit for providing a first reset signal at an on-timing of a source voltage, and for turning off the first reset signal when a potential of the capacitor increases to reach a prescribed level in a power-on mode; and
    a power-off reset circuit for providing a second reset signal when a potential of the capacitor decreases down to a certain value after an off-timing of the source voltage, and for sustaining the second reset signal until the source voltage becomes substantially zero in a power-off mode,
    wherein the power-on reset circuit comprises an amplification element for supplying a charging current to the capacitor, and an inverter for outputting the first reset signal when a potential of the capacitor is below a prescribed threshold in the power-on mode.

11. A power-on/off reset circuit according to claim 9, wherein the power-off reset circuit comprises an amplification element for allowing a current to flow therethrough when the source voltage decreases down to the certain value, wherein the current gradually increases in accordance with further decreasing of the source voltage,
    a resistor for converting the current of the amplification element to a voltage, and
    an inverter for outputting the second reset signal when the voltage of the resistor is above a prescribed threshold in the power-off mode.

12. A power-on/off reset circuit according to claim 10, wherein the power-off reset circuit comprises an amplification element for allowing a current to flow therethrough when the source voltage decreases down to the certain value, wherein the current gradually increases in accordance with further decreasing of the source voltage,
    a resistor for converting the current of the amplification element to a voltage, and
    an inverter for outputting the second reset signal when the voltage of the resistor is above a prescribed threshold in the power-off mode.

13. A power-on/off reset circuit comprising:
    a capacitor;
    a first transistor connected with a source voltage for charging the capacitor;
    a first current mirror circuit for allowing a current to flow therein in proportion to a potential of the capacitor in a power-on mode where the source voltage gradually increases;
    a second transistor for converting the current to a voltage;
    an inverter for inputting the voltage to provide a reset signal in comparison with a prescribed threshold; and
    a second current mirror circuit for increasing the voltage input to the inverter in a power-off mode where the source voltage gradually decreases.

14. A power-on/off reset circuit according to claim 13, wherein the first current mirror circuit comprises a pair of transistors that are coupled together at gates in connection with the potential of the capacitor, and the second current mirror circuit comprises a pair of transistors that are coupled together at gates in connection with the source voltage.

* * * * *